(12) United States Patent
Uesaka

(10) Patent No.: US 9,236,850 B2
(45) Date of Patent: Jan. 12, 2016

(54) SIGNAL SEPARATION DEVICE

(71) Applicant: Murata Manufacturing Co., Ltd., Nagaokakyo-shi, Kyoto-fu (JP)

(72) Inventor: Kenichi Uesaka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 119 days.

(21) Appl. No.: 14/217,924

(22) Filed: Mar. 18, 2014

(65) Prior Publication Data

US 2014/0197903 A1 Jul. 17, 2014

Related U.S. Application Data

(63) Continuation of application No. PCT/JP2012/068803, filed on Jul. 25, 2012.

(30) Foreign Application Priority Data

Sep. 30, 2011 (JP) .................................. 2011-217366

(51) Int. Cl.
*H03H 9/72* (2006.01)
*H03H 9/70* (2006.01)
(Continued)

(52) U.S. Cl.
CPC ............ *H03H 9/725* (2013.01); *H03H 9/02535* (2013.01); *H03H 9/706* (2013.01); *H03H 9/059* (2013.01); *H03H 9/0542* (2013.01); *H03H 9/0576* (2013.01); *H03H 9/64* (2013.01); *H03H 9/6483* (2013.01)

(58) Field of Classification Search
CPC ............ H03H 9/02535; H03H 9/0542; H03H 9/0576; H03H 9/059; H03H 9/64; H03H 9/6483; H03H 9/725; H03H 9/706

USPC .......... 333/133, 186, 187, 188, 189, 193–196
See application file for complete search history.

(56) References Cited

U.S. PATENT DOCUMENTS 6,150,900 A 11/2000 Kadota et al.
7,116,187 B2 10/2006 Inoue
(Continued)

FOREIGN PATENT DOCUMENTS

JP 06-061783 * 3/1994
JP 11-330905 A 11/1999
(Continued)

OTHER PUBLICATIONS

Official Communication issued in International Patent Application No. PCT/JP2012/068803, mailed on Sep. 18, 2012.
(Continued)

*Primary Examiner* — Benny Lee
*Assistant Examiner* — Jorge Salazar, Jr.
(74) *Attorney, Agent, or Firm* — Keating & Bennett, LLP

(57) ABSTRACT

A signal separation device is a duplexer in which a reception frequency band is located at higher frequencies than a transmission frequency band. A series arm of a ladder transmission filter includes a plurality of series arm resonators, and parallel arms respectively include parallel arm resonators. The parallel arm resonators include the parallel arm resonators having resonant frequencies lower than those of the series arm resonators and the parallel arm resonator that has a resonant frequency which is located within the reception frequency band and which is higher than the resonant frequency of the series arm resonators and that has a lower capacitance than the series arm resonators and the parallel arm resonators.

16 Claims, 4 Drawing Sheets

(51) Int. Cl.
*H03H 9/02* (2006.01)
*H03H 9/05* (2006.01)
*H03H 9/64* (2006.01)

(56) References Cited

U.S. PATENT DOCUMENTS

2008/0150652 A1\* 6/2008 Itou .............................. 333/133
2008/0284540 A1 11/2008 Nishihara et al.
2010/0109801 A1 5/2010 Inoue et al.

FOREIGN PATENT DOCUMENTS

JP 2008-271230 A 11/2008
JP 2010-109894 A 5/2010

OTHER PUBLICATIONS

Official Communication issued in corresponding German Patent Application No. 11 2012 004 096.1, mailed on Dec. 5, 2014.

\* cited by examiner

FIG. 5
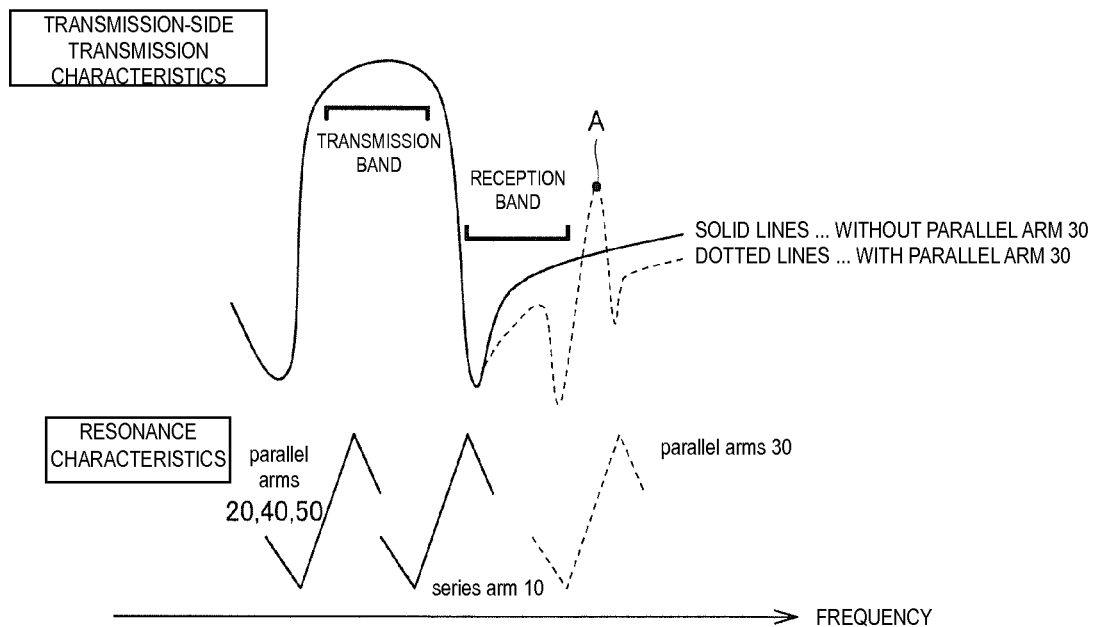
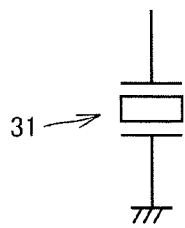
FIG. 6A
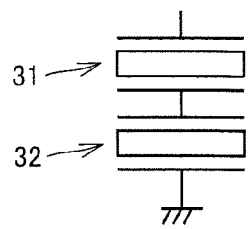
FIG. 6B

SIGNAL SEPARATION DEVICE

BACKGROUND OF THE INVENTION

1. Field of the Invention

The present invention relates to signal separation devices, and specifically relates to signal separation devices including a first passband and a second passband adjacent to each other.

2. Description of the Related Art

Japanese Unexamined Patent Application Publication No. 2008-271230 discloses a signal separation device that includes a transmission filter and a reception filter connected to an antenna and that has a configuration in which a ground potential connected to the reception filter is isolated from other ground potentials.

Japanese Unexamined Patent Application Publication No. 2010-109894 discloses a ladder-type signal separation device that has a transmission filter and a reception filter and that has a configuration in which a single parallel-arm resonator is used as a notch filter, thereby suppressing a sub-resonant response in the sub-resonant frequency band of the transmission filter or reception filter.

In the invention disclosed in Japanese Unexamined Patent Application Publication No. 2008-271230, routing of wiring lines for isolating the ground potentials from each other is necessary and the arrangement of ground electrodes is restricted. As a result, there may be a case in which it is difficult to reduce the size of the signal separation device.

In the invention disclosed in Japanese Unexamined Patent Application Publication No. 2010-109894, a sub-resonant response is suppressed in the sub-resonant frequency band which is relatively widely spaced apart from the passband of the transmission filter or reception filter. However, when the passband of the transmission filter and the passband of the reception filter are close to each other, the isolation characteristics between the transmission filter and the reception filter are degraded in some cases.

SUMMARY OF THE INVENTION

In view of the above-described problems, preferred embodiments of the present invention provide a signal separation device including a first passband and a second passband adjacent to each other that achieves improved isolation characteristics in a high-frequency-side passband.

A signal separation device according to a preferred embodiment of the present invention includes a first passband and a second passband that is located at frequencies higher than the first passband and that is adjacent to the first passband.

The signal separation device includes a common terminal; a first terminal; a second terminal; a first filter unit that is electrically connected between the common terminal and the first terminal and that defines at least the first passband; and a second filter unit that is electrically connected between the common terminal and the second terminal and that defines at least the second passband.

The first filter unit is a ladder filter including a series arm electrically connected between the common terminal and the first terminal; and a plurality of parallel arms electrically connected between the series arm and a ground potential.

The series arm includes at least one series arm resonator, and the plurality of parallel arms each include at least one parallel arm resonator.

The parallel arm resonators include at least one first resonator that has a lower resonant frequency than the series arm resonator and a second resonator that has a resonant frequency which is located within the second passband and which is higher than the resonant frequency of the series arm resonator and that has a lower capacitance than the series arm resonator and the first resonator.

In a preferred embodiment of the present invention, "the second resonator" may include a plurality of resonators. In this case, "the capacitance of (the second resonator)" refers to the composite capacitance of the plurality of resonators.

In a preferred embodiment of the present invention, at least one of the at least one series arm resonator is electrically connected between the second resonator and the common terminal in the above-described signal separation device.

In a preferred embodiment of the present invention, at least one of the at least one first resonator is electrically connected between the second resonator and the common terminal in the above-described signal separation device.

In a preferred embodiment of the present invention, the second resonator is configured in such a manner as to have a smaller ratio of an impedance at an anti-resonant point to an impedance at a resonant point than the first resonator, in the above-described signal separation device.

In a preferred embodiment of the present invention, in the above-described signal separation device, the first resonator is a surface acoustic wave resonator including a first reflector, and the second resonator is a surface acoustic wave resonator including a second reflector. The second reflector has a smaller number of electrode fingers than the first reflector.

In a preferred embodiment of the present invention, in the signal separation device, the first resonator is a surface acoustic wave resonator including first comb-shaped electrodes, and the second resonator is a surface acoustic wave resonator including second comb-shaped electrodes. The second comb-shaped electrodes have a smaller intersecting width than the first comb-shaped electrodes.

In a preferred embodiment of the present invention, in the signal separation device, the second resonator includes a plurality of resonators electrically connected in series.

According to various preferred embodiments of the present invention, in a signal separation device including a first passband and a second passband adjacent to each other, isolation characteristics in a high-frequency-side passband are enhanced.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 5 is a simplified diagram illustrating the transmission-side transmission characteristics and resonance characteristics of the signal separation device (duplexer) illustrated in FIG. 1.

FIGS. 6A and 6B are diagrams illustrating the configurations of parallel arm resonators included in a parallel arm.

DETAILED DESCRIPTION OF THE PREFERRED EMBODIMENTS

Hereinafter, preferred embodiments of the present invention will be described. Note that identical elements or equivalent elements are denoted by the same reference symbols and duplicated descriptions thereof may be omitted in some cases.

Note that in the preferred embodiments described below, when quantities or amounts are described, the scope of the present invention is not limited by these quantities or amounts, unless specifically described. Further, in the preferred embodiments described below, components of a configuration are not necessarily essential to the present invention unless specifically described.

Figure 1:
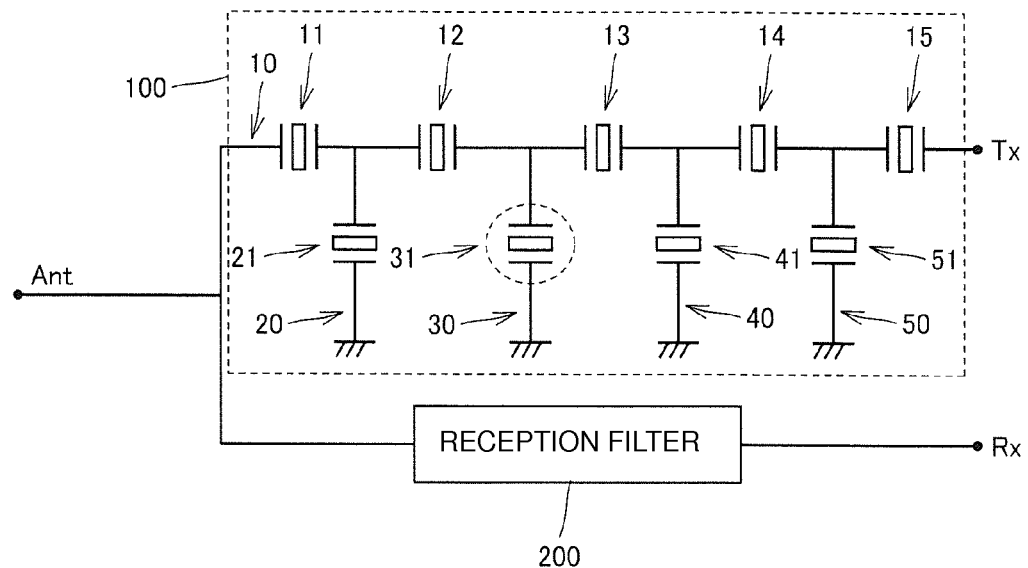
FIG. 1 is a schematic circuit diagram of a signal separation device (duplexer) according to a preferred embodiment of the present invention.

FIG. 1 is a schematic circuit diagram of a signal separation device according to a preferred embodiment of the present invention. The signal separation device according to the present preferred embodiment may preferably be mounted in, for example, a high-frequency device such as a cellular phone supporting a code division multiple access (CDMA) system such as Universal Mobile Telecommunications System (UMTS).

More specifically, the signal separation device according to the present preferred embodiment preferably is a duplexer supporting UMTS-BAND 5, for example. The transmission frequency band of UMTS-BAND 5 is the 824-849 MHz band and the reception frequency band thereof is the 869-894 MHz band.

In other words, in the signal separation device according to the present preferred embodiment, the transmission frequency band (first passband) and the reception frequency band (second passband) are adjacent to each other with a range of about 20 MHz therebetween, and the reception frequency band is located at higher frequencies than the reception frequency band.

However, the above duplexer is only non-limiting example. The signal separation device according to the present invention is not limited to the above duplexer. The present invention is applicable to a signal separation device such as a triplexer other than a duplexer.

Referring to FIG. 1, the signal separation device according to the present preferred embodiment includes an antenna terminal Ant (common terminal) connected to an antenna, a transmission terminal Tx (first terminal), and a reception terminal Rx (second terminal).

A transmission filter 100 (first filter unit) is connected between the antenna terminal Ant and the transmission terminal Tx. A reception filter 200 is connected between the antenna terminal Ant and the reception terminal Rx.

The transmission filter 100 defines a transmission frequency band and the reception filter 200 defines a reception frequency band.

Referring to FIG. 1, the transmission filter 100 preferably includes a ladder filter in which one-port surface acoustic wave resonators are connected in the shape of a ladder. The transmission filter 100 includes a series arm 10. Series arm resonators 11 to 15 are connected in series on the series arm 10. The transmission filter 100 includes parallel arms 20, 30, 40, and 50 connected between the series arm 10 and the ground. Parallel arm resonators 21, 31, 41, and 51 are respectively provided on the parallel arms 20, 30, 40, and 50. The series arm resonators 11 to 15 and the parallel arm resonators 21, 31, 41, and 51 each include a surface acoustic wave resonator.

Figure 2:
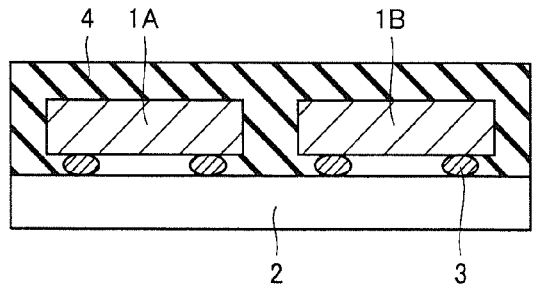
FIG. 2 is a schematic sectional view of an example of the signal separation device (duplexer) according to a preferred embodiment of the present invention.

FIG. 2 is a schematic sectional view of the signal separation device according to the present preferred embodiment. Referring to FIG. 2, the signal separation device (duplexer) includes a transmission-side surface acoustic wave filter chip 1A and a reception-side surface acoustic wave filter chip 1B, and a wiring substrate 2 made of, for example, a ceramic or a resin.

Each of the filter chips 1A and 1B is a chip in which a plurality of resonators each including comb-shaped electrodes and reflectors are provided on a piezoelectric substrate and are electrically connected. The piezoelectric substrate is made of, for example, lithium tantalate ($LiTaO_3$: LT) or lithium niobate ($LiNbO_3$: LN). The comb-shaped electrodes and reflectors are made of, for example, Al, Pt, Au, Ti, NiCr and include multilayer electrodes including Al layers and Ti layers.

The filter chips 1A and 1B are flip-chip mounted on the wiring substrate 2 through bumps 3. On the wiring substrate 2, a sealing resin 4 including, for example, an epoxy resin is arranged in such a manner as to cover the filter chips 1A and 1B. In other words, the duplexer according to the present preferred embodiment is a chip size package (CSP) surface acoustic wave filter device. Further, the duplexer according to the present preferred embodiment may be used as a wafer level package (WLP) surface acoustic wave filter device.

Figure 3:
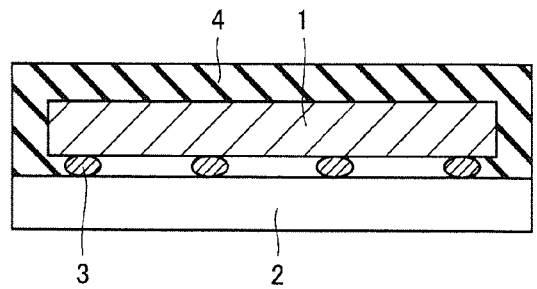
FIG. 3 is a schematic sectional view of another example of the signal separation device (duplexer) according to a preferred embodiment of the present invention.

FIG. 3 is a schematic sectional view of a modification of the above-described signal separation device. Referring to FIG. 3, the transmission-side and reception-side surface acoustic wave filter chips may be configured as a single filter chip 1.

Referring again to FIG. 1, the signal separation device according to the present preferred embodiment includes the parallel arm 30 (parallel arm resonator 31).

Specifically, in the duplexer illustrated in FIG. 1, the resonant frequency of the parallel arm resonator 31 is set higher than those of the other resonators (the series arm resonators 11 to 15 and the parallel arm resonators 21, 41, and 51) and within the range of the reception frequency band. Further, the capacitance of the parallel arm resonator 31 is set lower than, preferably lower than or equal to about 50% of, those of the other resonators (the series arm resonators 11 to 15 and the parallel arm resonators 21, 41, and 51). More specifically, the capacitance of the parallel arm resonator 31 is set to about 12% of the average of the capacitances of the other resonators. When the piezoelectric substrates are made of the same material, for a given pitch between, and a duty ratio of, the electrode fingers of each comb-shaped electrode, the capacitance has a positive correlation with the product of the intersecting width of the comb-shaped electrodes and the number of electrode fingers. Hence, the above-described setting can be realized by making the product of the intersecting width and the number of electrode fingers of the parallel arm resonator 31 be smaller than the average of those of the other resonators. Note that the duty ratio is obtained by dividing the width of an electrode finger of the comb-shaped electrode by the sum of the width of the electrode finger and the width of a space between the electrode finger and an adjacent electrode finger.

The characteristics of the signal separation device (duplexer) designed in the above-described manner will be described with reference to FIG. 4A, 4B and FIG. 5. Note that in FIG. 5, the illustration has been simplified to describe the principle of the improvement of the characteristics.

Figures 4A, 4B:
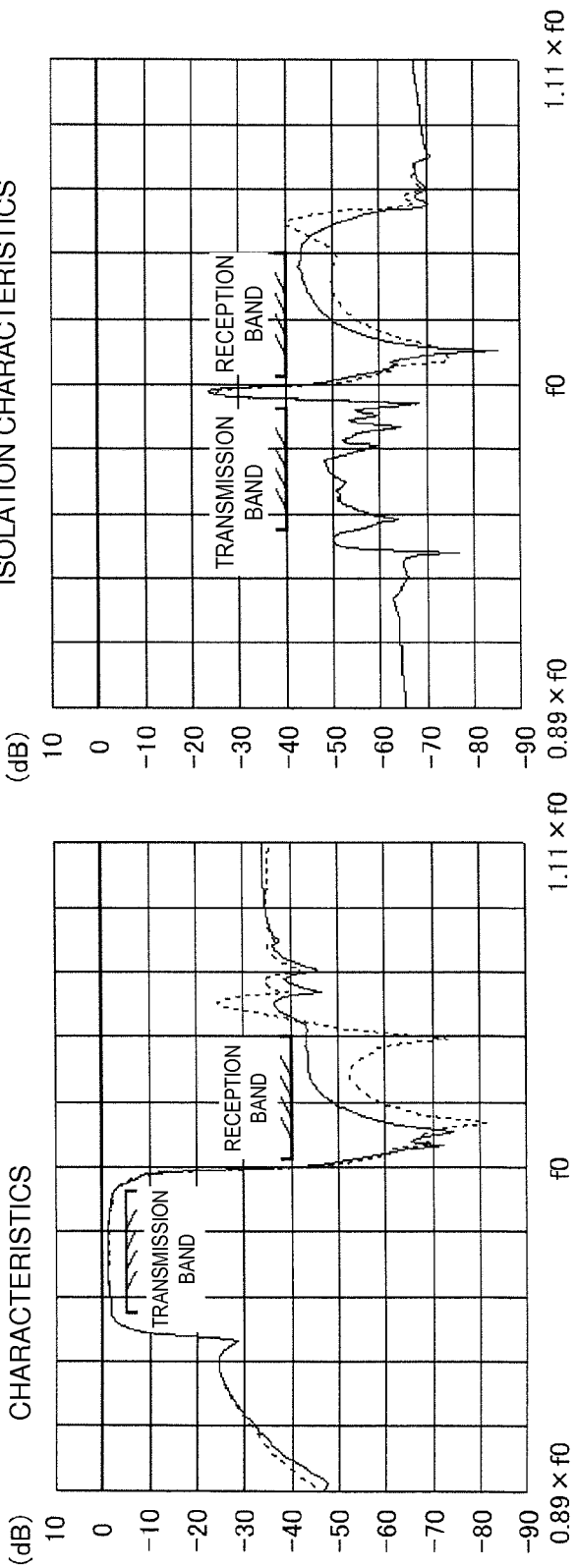
FIGS. 4A and 4B are diagrams illustrating the transmission-side transmission characteristics and isolation characteristics of the signal separation device (duplexer) illustrated in FIG. 1.

Referring to FIGS. 4A and 4B, the vertical axis of FIG. 4A represents transmission-side transmission characteristics and the vertical axis of FIG. 4B represents isolation characteristics, both marked in 10 dB increments. The respective horizontal axes represent frequencies normalized by the center frequency (f0) of the transmission frequency band and the reception frequency band. The solid lines in FIGS. 4A and 4B illustrate the characteristics when the parallel arm 30 is removed (i.e., open) and the dotted lines illustrate the characteristics when the parallel arm 30 is provided as illustrated in FIG. 1.

As is clear from FIGS. 4A and 4B, by providing the parallel arm 30, the transmission-side transmission characteristics in the reception frequency band and the isolation characteristics indicating isolation of the reception side from the transmission side are improved. The principle of this improvement is as follows.

Referring to FIG. 5, the resonant frequencies of the series arm resonators 11 to 15 of the series arm 10 are higher than those of the parallel arm resonators 21, 41, and 51 of the respective parallel arms 20, 40, and 50. In the present preferred embodiment, the resonant frequency of the parallel arm resonator 31 included in the parallel arm 30 is set to a frequency even higher than the resonant frequency of the series arm resonator 11 and is positioned in the reception frequency band. With this configuration, in the reception frequency band, a signal from the transmission terminal Tx to the antenna terminal Ant flows to a ground electrode through the parallel arm 30. As a result, attenuation in the reception frequency band of the transmission filter 100 is improved and the strength of a signal reaching the reception terminal Rx is suppressed, such that the isolation characteristics in the reception frequency band are improved.

As described above, by setting the resonant frequency of the parallel arm resonator 31 to frequencies higher than the resonant frequencies of the series arm resonators 11 to 15, the isolation characteristics in the reception band are improved. On the other hand, to maintain the intra-band characteristics of the transmission filter 100, the capacitance of the parallel arm resonator 31 needs to be made small. In other words, in the transmission frequency band, the closer to being open the parallel arm 30 is, the more the degradation of the intra-band characteristics is prevented. Hence, in the present preferred embodiment, the capacitance of the parallel arm resonator 31 is set lower than the capacitances of the other resonators (the series arm resonators 11 to 15 and the parallel arm resonators 21, 41, and 51). Note that since the capacitance of a resonator is related to the numbers of electrode fingers of comb-shaped electrodes, intersecting width, distance between the electrode fingers, and the like, the capacitance of the parallel arm resonator 31 preferably is set lower than the capacitances of the other resonators by adjusting the configuration of the electrode fingers such as the number of electrode fingers and the intersecting width in each resonator.

FIGS. 6A and 6B illustrate configurations of parallel arm resonators included in the parallel arm 30. In the example illustrated in FIG. 6A, the parallel arm 30 preferably includes the single resonator 31 similarly to the case illustrated in FIG. 1. On the other hand, in the example of FIG. 6B, the parallel arm 30 preferably includes the two resonators 31 and 32 connected in series. The parallel arm 30 may include three or more resonators.

When the configuration illustrated in FIG. 6B, where resonators are serially arranged, is used, a setting is made in such a manner that the composite capacitance of the resonators 31 and 32 become lower than the capacitances of the other resonators (the series arm resonators 11 to 15 and the parallel arm resonators 21, 41, and 51). Also in the case where the parallel arms 20, 40, and 50 each include a plurality of resonators, the capacitance of the parallel arm 30 is compared with each composite capacitance of the plurality of resonators.

As described above, with the signal separation device according to the present preferred embodiment, isolation characteristics within a reception frequency band are enhanced. Further, the isolation characteristics are enhanced only by changing the circuit of the transmission filter 100. Specifically, the signal separation device according to the present preferred embodiment will be compared with an existing signal separation device in which isolation characteristics are enhanced by changing the shapes of grounding patterns arranged in the wiring substrate having a multilayer wiring structure where a filter chip is mounted or increasing the number of connection vias electrically connected through the insulating layers of the wiring substrate. With the signal separation device according to the present preferred embodiment, the isolation characteristics are enhanced by adjusting the numbers of electrode fingers or the intersecting widths of comb-shaped electrodes in the circuit of the transmission filter 100 and there is no need to change the shapes of grounding patterns or increase the number of connection vias included in the wiring substrate of a package. As a result, the isolation characteristics are enhanced while reducing the size of the signal separation device.

As illustrated in FIG. 1, the series arm resonators 11 and 12 and the parallel arm resonator 21 are provided between the parallel arm resonator 31 and the antenna terminal Ant and, hence an influence on the reception filter 200 caused by providing the parallel arm resonator 31 in the circuit of the transmission filter 100 is significantly reduced or prevented. As a result, the isolation characteristics are improved without changing the design of the reception filter 200.

In the present preferred embodiment, by setting the resonant frequency of the parallel arm resonator 31 at a high frequency, the transmission-side transmission characteristics in the reception band are improved as described above. However, in a range higher than the reception frequency band, a peak ("A" in FIG. 5) corresponding to the anti-resonant response of the parallel arm resonator 31 appears in the transmission characteristics curve. In this portion, a local reverse phenomenon is observed compared with the curve (solid line in FIG. 5) of the transmission characteristics obtained in the case where the parallel arm 30 is not included.

Hence, in the present preferred embodiment, the above-described peak is made small by setting the impedance ratio of the impedance at the anti-resonant point of the parallel arm resonator 31 to the impedance at the resonant point of the parallel arm resonator 31 at a value lower than those impedance ratios in the parallel arm resonators 21, 41, and 51 (that is, the rising portion of the impedance of the parallel arm resonator 31 at the anti-resonant frequency is made gradual). As a result, further improvement in the transmission characteristics and the isolation characteristics is realized.

Figure 7:
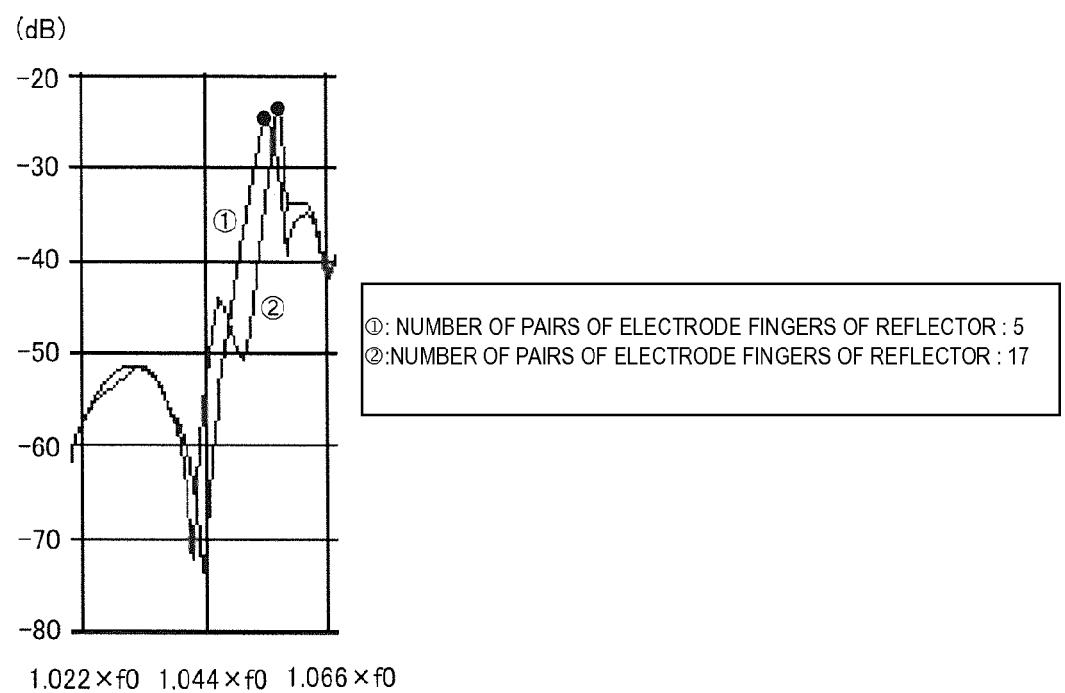
FIG. 7 is a diagram illustrating transmission-side transmission characteristics when the numbers of electrode fingers of reflectors are decreased while using the same added parallel arm, in the signal separation device (duplexer) illustrated in FIG. 1.

In addition, in the present preferred embodiment, the number of electrode fingers of each reflector in the parallel arm resonator 31 is made smaller than the number of electrode fingers of each reflector in the other parallel arm resonators 21, 41, and 51. As a result, the impedance ratio of the parallel arm resonator 31 can be made small, and when the number of electrode fingers of each reflector is decreased from 17 to 5 in the preferred embodiment corresponding to the dotted line illustrated in FIG. 4A, the peak corresponding to the anti-resonant response of the parallel arm resonator 31 in the transmission characteristics curve is decreased by about 3 dB, as illustrated in FIG. 7, such that improvement of the transmission-side transmission characteristics is realized. In addition, since the reflectors of the parallel arm resonator 31 is made small, the signal separation device is reduced in size.

Note that the inventor of the present application has confirmed that the impedance ratio of the surface acoustic wave resonator is decreased by decreasing the number of electrode fingers of each reflector in the resonator.

In the present preferred embodiment, the intersecting width of the comb-shaped electrodes in the parallel arm resonator is made smaller than the intersecting widths of the comb-shaped electrodes in the parallel arm resonators 21, 41, and 51.

Specifically, the intersecting width of the comb-shaped electrodes of the parallel arm resonator 31 preferably is less than or equal to about 10 wavelengths, for example, whereas the intersecting widths of the comb-shaped electrodes of the other parallel arm resonators 21, 41, and 51 are about 20 to 30 wavelengths, for example. It is preferable that the intersecting width of the comb-shaped electrodes of the parallel arm resonator 31 be about 1/10 to about 10 wavelengths and less than or equal to about half the intersecting widths of the other parallel arm resonators 21, 41, and 51, for example. This allows the parallel arm resonator 31 to have a smaller impedance ratio than the other parallel arm resonators 21, 41, and 51 and, hence, further improvement of the isolation characteristics is favorably realized. Note that the above wavelength is defined as being the wavelength λ of an elastic wave determined by the pitch of the electrode fingers of the comb-shaped electrodes. The intersecting width of comb-shaped electrodes is defined as being the length of the electrode fingers, in their extending direction, which are superposed with one another in the direction in which a surface acoustic wave excited by an IDT propagates, where the neighboring electrode fingers are connected to different potentials.

Note that the inventor of the present application has confirmed that by decreasing the intersecting width of the comb-shaped electrodes in a surface acoustic wave resonator, the impedance ratio of the resonator is also decreased.

Further, as illustrated in FIG. 6B, by providing the parallel arm 30 with the parallel arm resonators 31 and 32 connected in series, compared with the case in which the parallel arm 30 include the single parallel arm resonator 31, the capacitances of the parallel arm resonators 31 and 32 are increased while the composite capacitance is kept about the same (that is, lower than those of the parallel arms 20, 40, and 50). As a result, the electric power handling capabilities of the resonators which form the parallel arm 30 are increased.

The content described above is summarized as follows. The signal separation device according to the present preferred embodiment preferably is a duplexer having a transmission frequency band (824 MHz to 849 MHz) and a reception frequency band (869 MHz to 894 MHz) which is located at higher frequencies than the transmission frequency band and is adjacent to the transmission frequency band. The duplexer includes the antenna terminal Ant, the transmission terminal Tx, the reception terminal Rx, the transmission filter 100 that is electrically connected between the antenna terminal Ant and the transmission terminal Tx and that defines the transmission frequency band, and the reception filter 200 that is electrically connected between the antenna terminal Ant and the reception terminal Rx and that defines the reception frequency band. The transmission filter 100 is a ladder filter that includes the series arm 10 electrically connected between the antenna terminal Ant and the transmission terminal Tx and the plurality of parallel arms 20, 30, 40, and 50 electrically connected between the series arm 10 and a ground potential. The series arm 10 includes the series arm resonators 11 to 15 and the parallel arms 20, 30, 40, and 50 respectively include the parallel arm resonators 21, 31, 41, and 51. The parallel arm resonators 21, 31, 41, and 51 include the resonators 21, 41, and 51 (first resonators) having lower resonant frequencies than the series arm resonators 11 to 15 and the parallel arm resonator 31 (second resonator) that has a resonant frequency located within the reception frequency band and higher than the resonant frequencies of the series arm resonators 11 to 15, and that has a lower capacitance than the series arm resonators 11 to 15 and the parallel arm resonators 21, 41, and 51.

The preferred embodiments of the present invention have been described above. However, the preferred embodiments disclosed herein are examples in all the points and are not restrictive. The scope of the present invention is described by the claims and it is intended that all the modifications equivalent to and within the scope of the claims are included.

Preferred embodiments of the present invention are applicable to signal separation devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A signal separation device including a first passband and a second passband that is located at higher frequencies than the first passband and that is adjacent to the first passband, the device comprising:
   a common terminal;
   a first terminal;
   a second terminal;
   a first filter unit that is electrically connected between the common terminal and the first terminal and that defines at least the first passband; and
   a second filter unit that is electrically connected between the common terminal and the second terminal and that defines at least the second passband; wherein
   the first filter unit is a ladder filter including:
      a series arm electrically connected between the common terminal and the first terminal; and
      a plurality of parallel arms electrically connected between the series arm and a ground potential; wherein
      the series arm includes at least one series arm resonator;
      the plurality of parallel arms each include at least one parallel arm resonator; and
      the plurality of parallel arm resonators include at least one first resonator that has a lower resonant frequency than the at least one series arm resonator and a second resonator that has a resonant frequency which is located within the second passband and which is higher than a resonant frequency of the at least one series arm resonator and the second resonator has a lower capacitance than a capacitance of the at least one series arm resonator and a capacitance of the at least one first resonator.

2. The signal separation device according to claim 1, wherein the at least one series arm resonator and one of the plurality of parallel arm resonators are provided between another resonator of the plurality of parallel arm resonators and the common terminal.

3. The signal separation device according to claim 1, wherein any one of the at least one series arm resonator is electrically connected between the second resonator and the common terminal.

4. The signal separation device according to claim 1, wherein any one of the at least one first resonator is electrically connected between the second resonator and the common terminal.

5. The signal separation device according to claim 1, wherein the second resonator has a smaller ratio of an impedance at an anti-resonant point to an impedance at a resonant point than that of the first resonator.

6. The signal separation device according to claim 5, wherein
   the at least one first resonator is a surface acoustic wave resonator including a first reflector;
   the second resonator is a surface acoustic wave resonator including a second reflector; and
   the second reflector has a smaller number of electrode fingers than the first reflector.

7. The signal separation device according to claim 5, wherein
   the at least one first resonator is a surface acoustic wave resonator including first comb-shaped electrodes;
   the second resonator is a surface acoustic wave resonator including second comb-shaped electrodes; and
   the second comb-shaped electrodes have a smaller overlapping width than the first comb-shaped electrodes.

8. The signal separation device according to claim 1, wherein the second resonator includes a plurality of resonators electrically connected in series.

9. The signal separation device according to claim 1, wherein the first passband and the second passband are adjacent to each other with a range of about 20 MHz therebetween.

10. The signal separation device according to claim 1, wherein the signal separation device is one of a duplexer and a triplexer.

11. The signal separation device according to claim 1, wherein each of the first filter unit and the second filter unit is a surface acoustic wave filter chip.

12. The signal separation device according to claim 1, wherein the signal separation device is a duplexer defined by one of a chip size package surface acoustic wave filter device and a wafer level package surface acoustic wave filter device.

13. The signal separation device according to claim 1, wherein both of the first filter unit and the second filter unit are defined by a single surface acoustic wave filter chip.

14. The signal separation device according to claim 1, wherein one of the plurality of parallel arm resonators includes at least two resonators connected in series.

15. A communication device comprising the signal separation device according to claim 1.

16. The communication device according to claim 15, wherein the communication device is a cellular phone.

* * * * *